(12) United States Patent
Vanheusden et al.

(10) Patent No.: US 7,704,866 B2
(45) Date of Patent: Apr. 27, 2010

(54) METHODS FOR FORMING COMPOSITE NANOPARTICLE-METAL METALLIZATION CONTACTS ON A SUBSTRATE

(75) Inventors: Karel Vanheusden, Los Altos, CA (US); Francesco Lemmi, Sunnyvale, CA (US); Dmitry Poplavskyy, San Jose, CA (US); Mason Terry, Redwood City, CA (US); Malcolm Abbott, Sunnyvale, CA (US)

(73) Assignee: Innovalight, Inc., Sunnyvale, CA (US)

( * ) Notice: Subject to any disclaimer, the term of this patent is extended or adjusted under 35 U.S.C. 154(b) by 213 days.

(21) Appl. No.: 12/050,635

(22) Filed: Mar. 18, 2008

(65) Prior Publication Data
US 2009/0239330 A1    Sep. 24, 2009

(51) Int. Cl.
*H01L 21/00* (2006.01)
*H01L 21/8238* (2006.01)
*H01L 21/265* (2006.01)

(52) U.S. Cl. .......... 438/533; 438/48; 438/523; 257/44; 257/343; 257/503; 257/621; 257/690; 977/773; 977/775; 977/777; 977/778; 977/939

(58) Field of Classification Search .......... 438/98, 438/233, 523, 533, 618–621; 257/44, 343, 257/503, 621, 690, 742, 743, E33.066, E29.299; 977/773, 775, 777–787, 814, 939
See application file for complete search history.

(56) References Cited

U.S. PATENT DOCUMENTS 5,720,827 A    2/1998    Simmons ............ 438/98

5,766,971 A    6/1998    Ahlgren et al.

(Continued)

FOREIGN PATENT DOCUMENTS

DE    103 26 538 A1    1/2005

(Continued)

OTHER PUBLICATIONS

Ravirajan et al. "Hybrid nanocrystalline TiO2 solar cells with a fluorene-thiophene copolymer as a sensitizer and hole condcutor", Journal of Applied Physics, Feb. 2004, vol. 95, No. 3, pp. 1473-1480.*

(Continued)

*Primary Examiner*—Ha Tran T Nguyen
*Assistant Examiner*—Karen M Kusumakar
(74) *Attorney, Agent, or Firm*—Foley & Lardner LLP

(57) ABSTRACT

A method for forming a contact to a substrate is disclosed. The method includes providing a substrate, the substrate being doped with a first dopant; and diffusing a second dopant into at least a first side of the substrate to form a second dopant region, the first side further including a first side surface area. The method also includes forming a dielectric layer on the first side of the substrate. The method further includes forming a set of composite layer regions on the dielectric layer, wherein each composite layer region of the set of composite layer regions further includes a set of Group IV semiconductor nanoparticles and a set of metal particles. The method also includes heating the set of composite layer regions to a first temperature, wherein at least some composite layer regions of the set of composite layer regions etch through the dielectric layer and form a set of contacts with the second dopant region.

33 Claims, 9 Drawing Sheets

U.S. PATENT DOCUMENTS

| | | | |
|---|---|---|---|
| 6,239,355 | B1 | 5/2001 | Salafsky |
| 6,277,766 | B1 | 8/2001 | Ayers |
| 6,358,613 | B1 | 3/2002 | Buriak |
| 6,485,986 | B1 | 11/2002 | Buriak et al. |
| 6,569,979 | B1 | 5/2003 | Strother et al. |
| 6,677,163 | B1 | 1/2004 | Boukherroub et al. |
| 6,710,366 | B1 | 3/2004 | Lee et al. |
| 6,846,681 | B2 | 1/2005 | Buriak et al. |
| 6,869,864 | B2 | 3/2005 | Yim et al. |
| 6,878,871 | B2 | 4/2005 | Scher et al. |
| 6,897,471 | B1 | 5/2005 | Soref et al. |
| 6,943,054 | B2 | 9/2005 | Bocian et al. |
| 6,986,818 | B2 | 1/2006 | Tillotson et al. |
| 7,309,650 | B1 * | 12/2007 | Wang et al. ............... 438/665 |
| 7,443,027 | B2 * | 10/2008 | Wu et al. ............... 257/734 |
| 2004/0095658 | A1 | 5/2004 | Buretea et al. |
| 2004/0229447 | A1 | 11/2004 | Swihart et al. |
| 2004/0266148 | A1 | 12/2004 | Yim et al. |
| 2005/0008880 | A1 | 1/2005 | Kunze et al. |
| 2005/0107478 | A1 | 5/2005 | Klimov et al. |
| 2005/0126628 | A1 | 6/2005 | Scher et al. |
| 2005/0150541 | A1 | 7/2005 | Scher et al. |
| 2005/0183766 | A1 | 8/2005 | Nakajima et al. |
| 2005/0214967 | A1 | 9/2005 | Scher et al. |
| 2006/0060862 | A1 | 3/2006 | Bawendi et al. |
| 2007/0006914 | A1 | 1/2007 | Lee |
| 2008/0160265 | A1 | 7/2008 | Hieslmair et al. |
| 2008/0160733 | A1 | 7/2008 | Hieslmair et al. |

FOREIGN PATENT DOCUMENTS

| | | |
|---|---|---|
| JP | 2004-071716 | 3/2004 |
| JP | 2005-217046 | 8/2005 |
| JP | 2005-332913 | 12/2005 |
| WO | WO 99/21934 | 5/1999 |
| WO | WO 2004/023527 | 3/2004 |
| WO | WO 2004/068536 | 8/2004 |
| WO | WO 2004/093202 | 10/2004 |
| WO | WO 2005/075048 | 8/2005 |
| WO | WO 2006/034025 | 3/2006 |
| WO | WO 2006/063893 | 6/2006 |

OTHER PUBLICATIONS

"DuPont Photovoltaic Solutions," *Product Information Sheet K-15733*, pp. 1-2, Aug. 2006.

Preston et al., "Solar Energy Research at the Department of Energy. Big Deal!", Oct. 19, 2005.

S. L. Dexheimer and K. G. Lynn, "Novel Characterization Methods for Microcrystalline Silicon", *Subcontractor Report*, National Renewable Energy Laboratory, NREL/SR-520-34949, Oct. 2003.

L. Sawires, "A new advanced microwave technology promises to increase the speed and energy efficiency of annealing, coating and joining everything from glass and ceramics to semiconductors", Nov. 1, 2002, available at http://www.ceramicindustry.com/, last visited Jun. 3, 2008.

R. E. I. Schropp, "Thin Film Silicon PV: Research and Implementation (PowerPoint)", *Zonneceldag 2003*, Utrecht University, Debye Institute, Physics of Devices, Sep. 30, 2003.

Garcia-Serrano, J. et al., "Formation and vibrational structure of Si nano-clusters in ZnO matrix," *Revista Mexicana De Fisica*, 47(1), Feb. 2001, pp. 26-29.

Ray, S. K. et al., "Luminescence characteristics of Ge nanocrystals embedded in $SiO_2$ matrix," *Optical Materials*, 27, Feb. 2005, pp. 948-952; published by Elsevier B.V.

Ando, M. et al., "Transient photocurrent of (silicon nanocrystals)-(organic polysilane) composites—detection of surface states of silicon nanocrystals," *Thin Solid Films*, 499 (1-2), Mar. 2006, pp. 119-122; published by Elsevier B.V.

Martucci, A. et al., "Microstructural and nonlinear optical properties of silica-titania sol-gel film doped with PbS quantum dots," *J. Applied Physics*, 86 (1), Jul. 1999, pp. 79-87; published by American Institute of Physics.

Guglielmi, M. et al., "Control of Semiconductor Particle Size in Sol-Gel Thin Films," *Journal of Sol-Gel Sciences and Technology*, 8, 1997, pp. 1017-1021; published by Kluwer Academic Publishers, The Netherlands.

Buriak, J. M., "Organometallic chemistry on Silicon and Germanium Surfaces," *Chemical Reviews*, 102 (5) (May 2002), pp. 1271-1308; published by American Chemical Society.

Lau, H. W. et al., "Defect-induced photoluminescence from tetraethylorthosilicate thin films containing mechanically milled silicon nanocrystals," *J. Applied Physics*, 97 (10) (May 2005), pp. 104307-1-104307-4; published by American Institute of Physics.

Dias, M. L. et al., "Core shell silica-silicon hybrid nanoparticles: synthesis and characterization," *J. Metastable and Nanocrystalline Materials*, 22 (2004), pp. 83-90; published by Trans Tech Publications, Switzerland.

International Search Report for PCT/US2007/067126, mailed Dec. 5, 2007.

International Search Report for PCT/US2007/073037, mailed Nov. 15, 2007.

Dang, Y. X. et al., "Study of the Interdiffusion Effect on the Band Structures of $Si_{1-x}Ge_x$/Si Quantum Wells," *Journal of Applied Physics*, vol. 99, No. 7, Apr. 10, 2006, pp. 076108-1-076108-3; published by American Institute of Physics.

Lenhart, J. L. et al., "Characterization of sizing layers and buried polymer/sizing/substrate interfacial regions using a localized fluorescent probe," *Journal of Colloid and Interface Science*, vol. 257 (2003), pp. 398-407; published by Elsevier Science (USA).

Li-Wei Tu et al., "Observation of quantum size effect in the resistivity of thin, gray tin epilayers", *Appl. Phys. Lett.*, vol. 55, No. 13, Sep. 25, 1989, pp. 1327-1329; published by American Institute of Physics.

Miesner, C. et al., "Intra-Valence Band Photocurrent Measurements on Ge Quantum Dots in Si," *Thin Solid Films*, vol. 380, No. 1-2, Dec. 22, 2000, pp. 180-182; published by Elsevier Science B.V.

Sarney, W. L. et al., "Microstructural Characterization of Quantum Dots with Type-II Band Alignments," *Solid-State Electronics*, vol. 50, No. 6, Jun. 2006, pp. 1124-1127; published by Elsevier Ltd.

Nozik, A. J., "Advanced Concepts for Photovoltaic Cells," Presented at the National Center for Photovoltaics and Solar Program Review Meeting: Denver, Colorado, Mar. 24-26, 2003, pp. 1-5.

Ellingson et al. "Highly Efficient Multiple Exciton Generation in Colloidal PbSe and PbS Quantum Dots," *Nano Letters*, vol. 5, No. 5, (2005) pp. 865-871; published by American Chemical Society.

Ellingson et al. "Nanocrystals Generating >1 Electron Per Photon May Lead to Increased Solar Cell Efficiency," Printed from website on Sep. 11, 2006: http://newsroom.spie.org/x3923.xml?ss=print.

Shang Yuan Ren, "Quantum Confinement in Semiconductor Ge Quantum Dots," *Solid State Communications*, vol. 102, No. 6 (1997) pp. 479-484; published by Elsevier Science Ltd.

Wenju Feng et al., "Self-Assembly and Characterization of Fullerene Monolayers on Si(100) Surfaces," *Langmuir American Chem. Soc. USA*, vol. 15, No. 9 (Apr. 27, 1999), pp. 3152-3156; published by American Chemical Society.

International Search Report for PCT/US2007/077007, mailed Mar. 17, 2008.

Chekalin, S. et al., "Ultrafast photoinduced processes in fullerene-metal nanostructures," *Proc. Spie. Int. Eng; Proceedings of Spie—The International Society for Optical Engineering; Photon Echo and Coherent Spectroscopy*, vol. 6181 (2005), Sep. 18, 2005, pp. 1-5.

Database WPI Week 200564, Derwent Publications Ltd., London, GB, reporting Abstract of JP2005-236278.

International Search Report for PCT/US2007/079393, mailed Sep. 25, 2008.

* cited by examiner

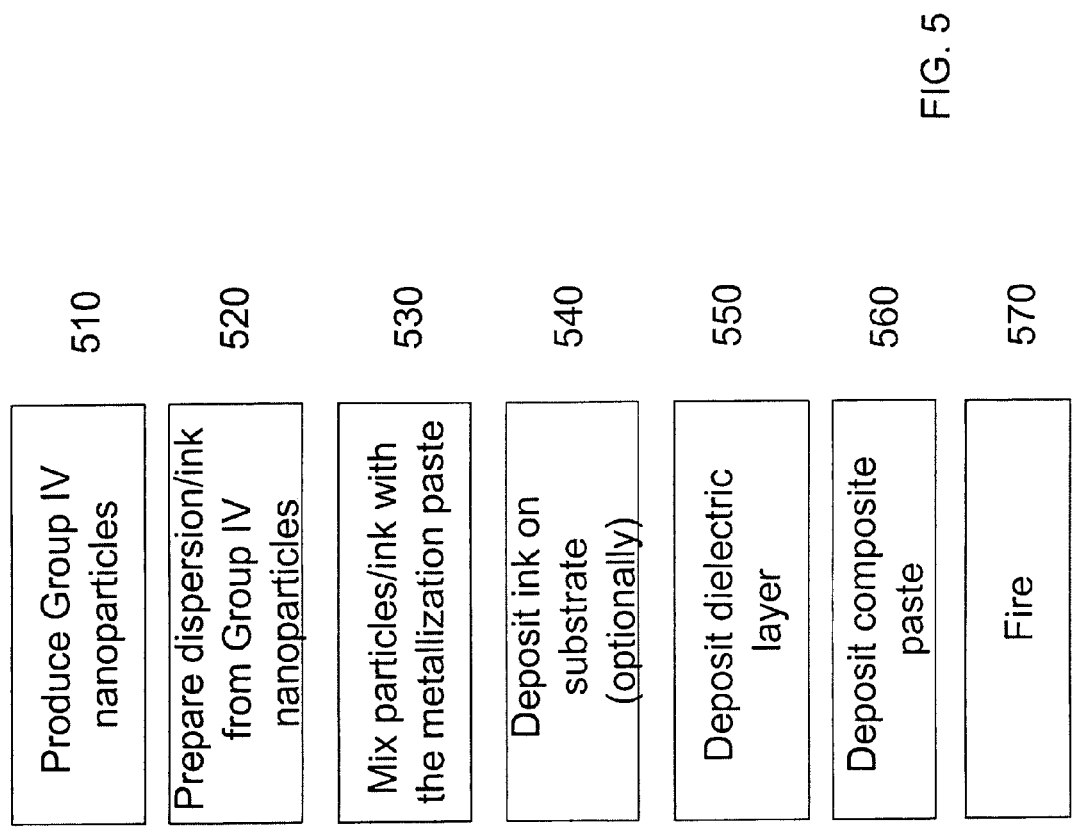

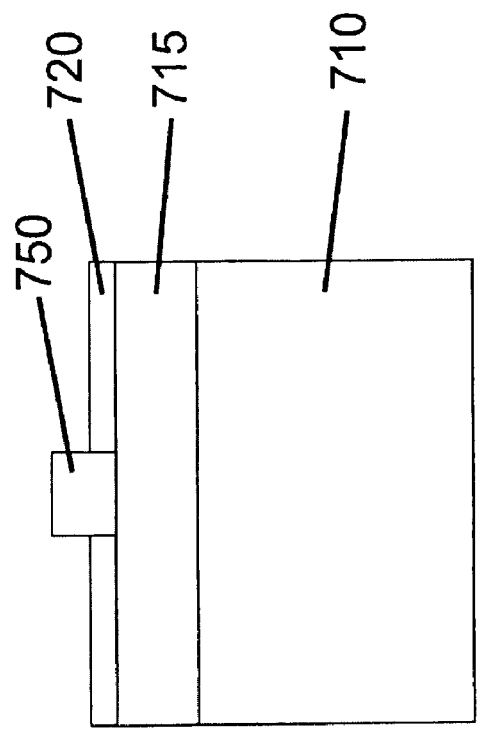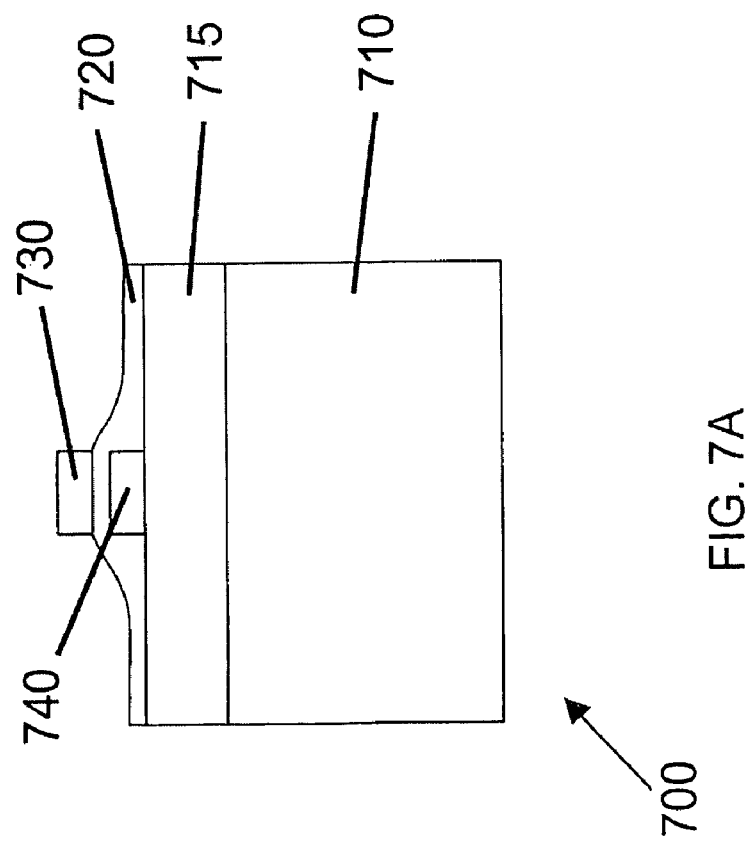
FIG. 7B
FIG. 7A

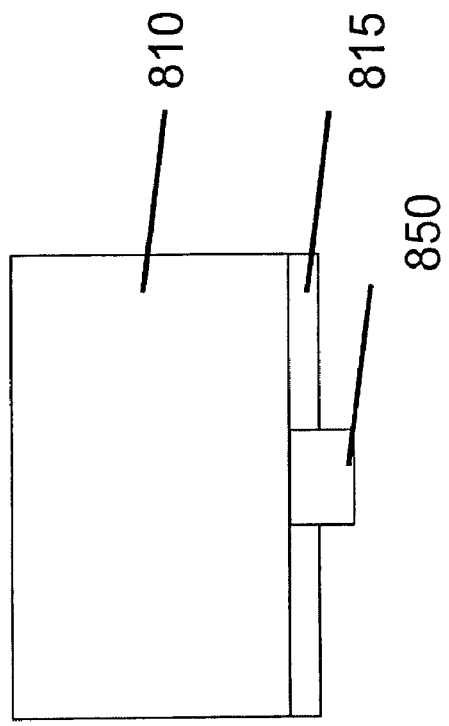
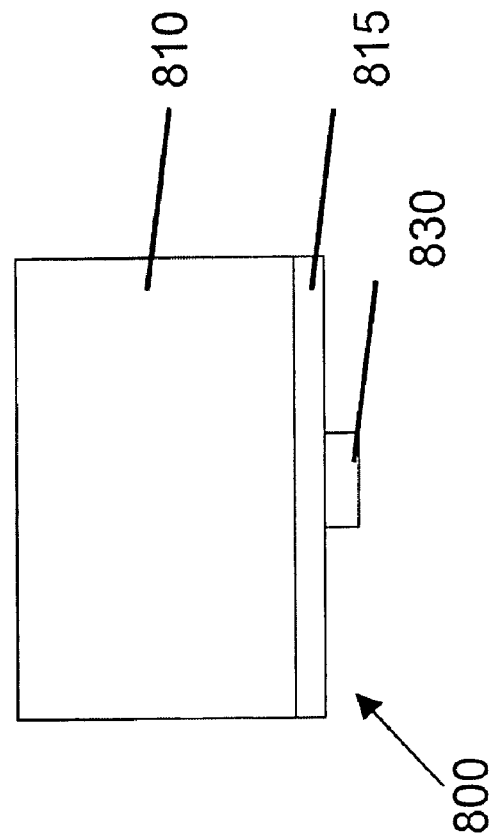
FIG. 8B
FIG. 8A

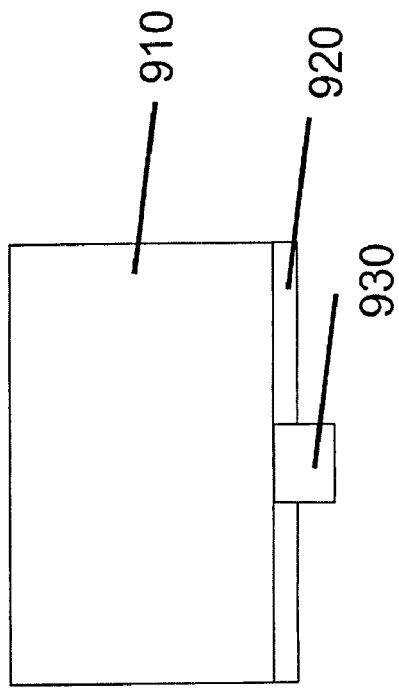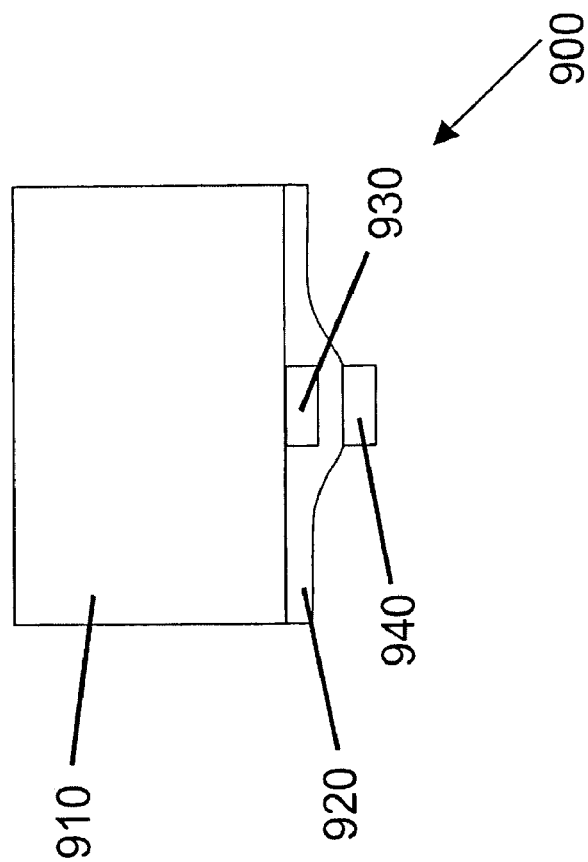
FIG. 9B
FIG. 9A

METHODS FOR FORMING COMPOSITE NANOPARTICLE-METAL METALLIZATION CONTACTS ON A SUBSTRATE

FIELD OF THE INVENTION

This disclosure relates to the fabrication of semiconductor thin films, more particularly to methods for forming composite nanoparticle metal regions on a substrate

BACKGROUND

Solar (photovoltaic) cells convert sunlight into electricity. Using an inexhaustible source of energy, the use of solar cells represents an alternative to fossil fuels that generate pollution contributing to global warning. However, in order to be economically viable, the electricity generated from solar cells must cost substantially less, either by reducing manufacturing costs or likewise by increasing efficiency.

Referring now to FIG. 1, a simplified generic photovoltaic cell is shown. Here, a solar cell is configured as an absorber with a collecting junction. In a typical silicon photovoltaic cell the absorber 103 is made up of an emitter 104 and a base region. Typically the base region is doped with atoms that create acceptor sites (e.g. boron) known as p-type silicon and the emitter region is doped with atoms that create donor sites (e.g. phosphorous) known as n-type silicon. The difference in electrostatic potential between these two regions forms the collecting junction at their interface.

In a process called photo excitation, absorbed photons of light generate electron hole pairs which are then free to move through the absorber 103 by a process of diffusion. If a diffusing carrier reaches the edge of the p-n junction it is collected and will generate current. To extract this current from the device it is necessary to include metal contacts on both the emitter and base regions. When located on the front side these metal electrodes must be patterned to allow incident light to enter the cell. In addition, the front surface of a solar cell is typically covered with a dielectric layer. This layer acts to both reduce the number of carriers lost to recombination at the front surface and to reduce the amount of light reflected from the front surface of the device. Since a dielectric does not conduct current it is necessary for the front metal electrode to contact directly to the silicon underneath this layer.

Performance of the solar cell device depends, at least in part, on the electrical contact (preferably, an ohmic contact) between electrode 105 (generally positioned above the dielectric layer) and emitter layer 104 (generally positioned below the dielectric layer). High contact resistance generally leads to a high total series resistance of the solar cell, which tends to adversely affect the fill factor (FF) and thus the overall efficiency of the solar cell. Furthermore, unwanted parasitic loss mechanisms, such as junction shunting caused by direct physical contact between the front metal and the base, will tend to result in a low junction shunt resistance which may also reduce the efficiency of the device.

To further improve the collection of carriers from within the bulk, a BSF (back surface field) layer 106 may also be added. Minimizing the impact of rear surface recombination, BSF layer 106 tends to repel those oppositely charged carriers that are located closer to the back-side. That is, the interface between BSF layer 106 and wafer absorber 103 tends to introduce a barrier to minority carrier flow to the rear surface, resulting in higher levels of minority carrier concentrations in the wafer absorber. For example, for a p-type wafer, Al (aluminum) or B (boron) may be added to repel electrons. In contrast, for an n-type wafer, P (phosphorous) may be added to repel holes. By enhancing the collection of carriers from within the bulk the efficiency of the device is improved.

The application of metal to the solar cell to create the front-side and back-side electrodes, or metallization, is generally one of the main efficiency and cost-determining steps in solar cell processing. For example, one approach of preparing front-side metal grids is to evaporate highly conductive metal layers through pre-defined shadow masks prepared, e.g., by photolithography. While yielding contact of higher quality, such approaches are not practical in the manufacturing environment where low cost and high throughput are required. An alternate approach to forming front-side metal grids includes using nickel and copper electroplated grooves, referred to as buried contacts. However, a problem with this approach is that it is also cost-intensive.

Yet a third widely used approach to front metal grids involves using screen printing technology. See, e.g., J. H. Wohlgemuth, S. Narayanan, and R. Brenneman, Proc. 21st IEEE PVSC, 221-226 (1990); J. F. Nijs, J. Sclufcik, J. Poortmans, S. Sivoththaman, and R. P. Mertens, IEEE Trans. on Elect. Dev. 46, 1948-1969 (1999). Here, the front metal grid is formed from a silver-based paste which is deposited on substrates (or material layers thereon) using a squeegee to force the paste through a screen comprised of wire mesh and a patterned emulsion. The silver-based paste typically consists of several main components, including (1) Ag particles that are typically less than about 1 μm in size, (2) a glass frit, which contains a variety of metal oxides, and (3) an organic binder.

Alternatively, the rear electrode may be formed using an Aluminum based paste which is deposited in a similar manner to the front side of the device. After deposition of both electrodes the paste is fired at a temperature of about 800° C.-900° C. During this firing process, the glass frit in the Ag based past removes the front surface dielectric layer allowing the metal to contact to the emitter layer underneath. On the rear side the firing cycle causes the Al to form a BSF layer simultaneously with electrode formation.

However, there are several disadvantages with the screen printing process described above which limit the efficiency and add complications to manufacturing. It is therefore desirable to find ways to improve this process.

SUMMARY

The invention relates, in one embodiment, to a method for forming a contact to a substrate. The method includes providing a substrate, the substrate being doped with a first dopant; and diffusing a second dopant into at least a first side of the substrate to form a second dopant region, the first, side further including a first side surface area. The method also includes forming a dielectric layer on the first side of the substrate. The method further includes forming a set of composite layer regions on the dielectric layer, wherein each composite layer region of the set of composite layer regions is configured further includes a set of Group IV semiconductor nanoparticles and a set of metal particles. The method also includes heating the set of composite layer regions to a first temperature, wherein at least some composite layer regions of the set of composite layer regions etch through the dielectric layer and form a set of contacts with the second dopant region.

BRIEF DESCRIPTION OF THE DRAWINGS

The invention will be better understood from the Detailed Description of the various configurations of the invention and from the appended drawings, which are meant to illustrate and not to limit the invention. The appended drawings are schematic, not drawn to scale.

FIG. 5 is a flow chart that depicts processing steps for the fabrication of Group IV semiconductor nanoparticle metallization contacts, in accordance with the invention;

FIGS. 7A-B illustrate a simplified set of diagrams showing the formation of a composite emitter contact, in accordance with the invention; and FIGS. 8A-B illustrate the formation of back contacts to doped regions in a substrate, in accordance with the invention.

FIGS. 9A-B illustrate the formation of back contacts to doped regions in a substrate, in accordance with the invention.

DETAILED DESCRIPTION

Figure 1:
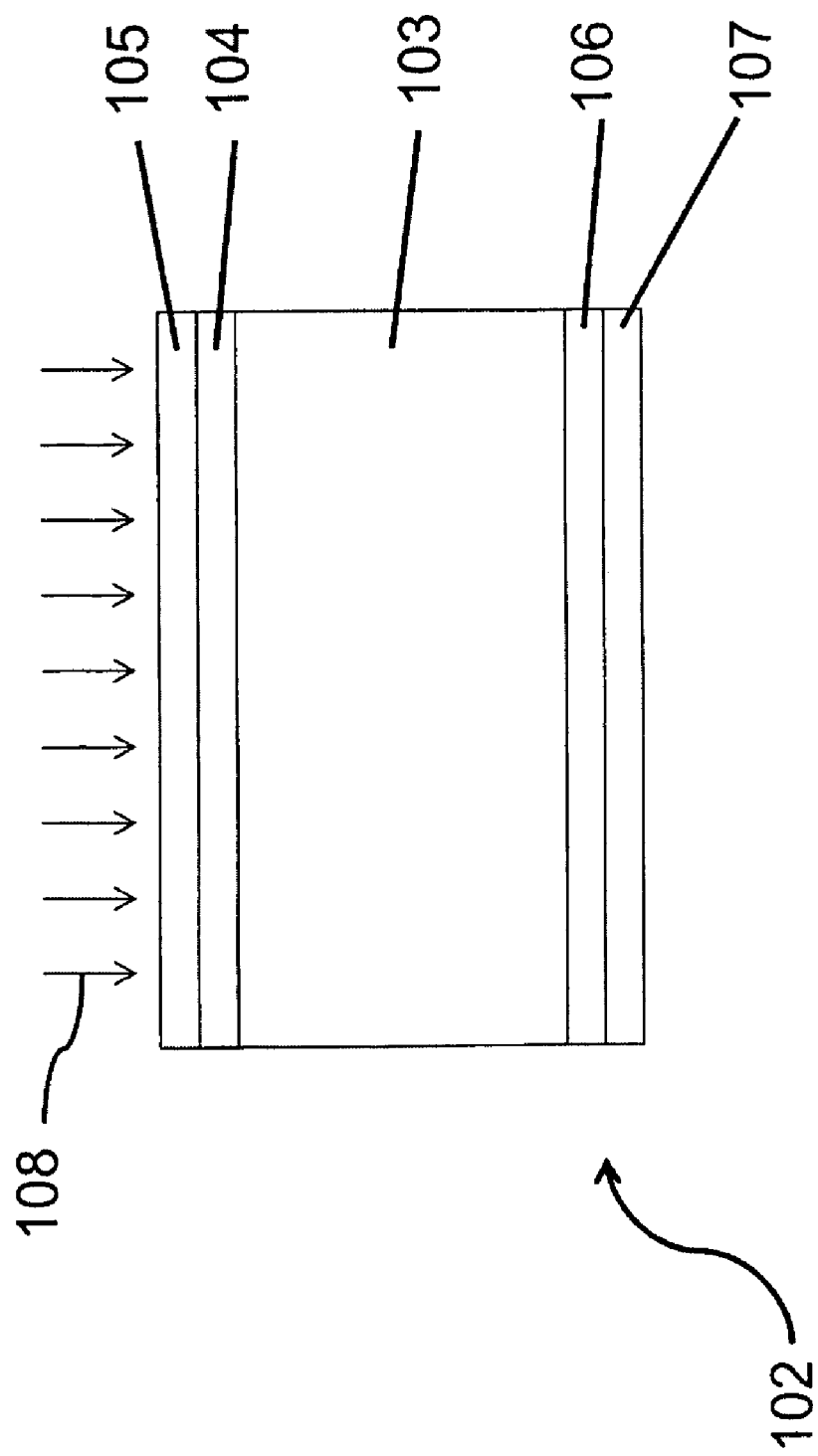
FIG. 1 is a schematic cross-section side view of a photovoltaic cell.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, there are a number of well known issues associated with using commercially available metal pastes for screen printing of contacts. One problem is high contact resistance (or poor metal conductivity), which generally leads to reduced fill factors.

Another problem is an increased junction leakage due to metal spiking resulting from firing, which further reduces the fill factor. Consequently, to achieve adequate contact resistance and to avoid metal spiking, deeper emitter diffusion is generally used (yielding sheet resistance of about 40-50 Ohm/sq), which results in a formation of the so-called "dead-layer" at the top of the emitter. This leads to higher recombination in the emitter, leading to poor blue response of the cell. An additional loss mechanism of screen print cells is high shading losses due to relatively wide front contact fingers (between about 100 and 150 μm).

In general, the fire-through process is strongly affected by the firing conditions and properties of the Ag-based paste (also "paste" herein). Overfiring can produce low resistivity contacts but may shunt the junction due to Ag spiking, while underfiring can result in high resistivity contacts. Consequently, a compromise is generally struck between achieving adequate series resistance while limiting the amount of junction shunting, resulting in a lower than ideal fill factor.

In particular, it has been shown that the process of paste fire-through depletes the emitter region of dopant atoms, resulting in higher contact resistance. See, e.g., Sopori el at, Proceedings of 17$^{th}$ Workshop on Crystalline Silicon Solar Cells and Modules, Vail, Colo., (2007). Generally, higher dopant concentration in a semiconductor yields lower contact resistance when metal comes in contact with a semiconductor. Accordingly, it is advantageous to have higher dopant concentration for better contact formation.

A selective emitter structure can provide an efficiency increase over the homogeneous diffused emitter solar cells discussed above. See, e.g., M. GREEN, SILICON SOLAR CELLS. ADVANCED PRINCIPLES AND PRACTICE Chap. 10 (Centre for Photovoltaic Devices and Systems, University of New South Wales, Sydney 1995). That is, increasing the dopant concentration in localized regions very close to metal and reducing the dopant concentrations in regions away from metal tend to reduce carrier recombination and provide a good contact (e.g., ohmic contact) with any metal contacts.

In addition to the issues associated with the front metallization, there are additional issues associated with the back contact pastes, particularly Al-based pastes, which are used to form a BSF layer in p-type silicon solar cells. In particular, an Al BSF process results in significant wafer bowing after a fire-through step, which is a result of significant mismatch between thermal expansion coefficients of aluminum and silicon. In addition, this process is not optimized as Al-BSF contacts are co-fired with the front metal grid, which requires a trade-off between firing conditions for front and back contacts. This results in relatively high recombination at the back of the device, despite the presence of the BSF.

Accordingly, there is a need in the art for pastes and methods for providing metallization on photovoltaic (or solar) cells, which yield low cost solar cells with improved properties, such as metal layers having improved contacts (lower resistance) with underlying material layers and reduced recombination losses.

Methods and formulations (e.g., Ag-based or Al-based pastes) of configurations provided herein enable formation of contacts to material layers (e.g., emitter layers) having improved properties relative to contacts formed using prior art pastes and methods. This provides several advantages, such as improved device performance and reduced processing costs.

Characteristics of Group IV Nanoparticles

In general, a nanoparticle is a microscopic particle with at least one dimension less than 100 nm. The term "Group IV nanoparticle" generally refers to hydrogen terminated Group IV nanoparticles having an average diameter between about 1 nm to 100 nm, and composed of silicon, germanium, carbon, or combinations thereof. The term "Group IV nanoparticle" also includes Group IV nanoparticles that are doped.

The Group IV particles may be produced in a plasma chamber, as well by other appropriate manufacturing techniques, such as evaporation (S. Ijima, Jap. J. Appl. Phys. 26, 357 (1987)), gas phase pyrolysis (K. A Littau, P. J. Szajowski, A. J. Muller, A. R. Kortan, L. E. Brus, J. Phys. Chem. 97, 1224 (1993)), gas phase photolysis (J. M. Jasinski and F. K. LeGoues, Chem. Mater. 3, 989 (1991);), electrochemical etching (V. Petrova-Koch et al., Appl. Phys. Lett. 61, 943 (1992)), plasma decomposition of silanes and polysilanes (H. Takagi et al, Appl. Phys. Lett. 56, 2379 (1990)), high pressure liquid phase reduction-oxidation reaction (J. R. Heath, Science 258, 1131 (1992)) and by refluxing the zintyl salt, KSi with excess silicon tetrachloride in a solvent of glyme, diglyme, or THF under nitrogen (R. A. Bley and S. M. Kauzlarich, J. Am. Chem. Soc., 118, 12461 (1996)).

In comparison to a bulk material (>100 nm) which tends to have constant physical properties regardless of its size (e.g., melting temperature, boiling temperature, density, conductivity, etc.), nanoparticles may have physical properties that are size dependent, and hence useful for applications such as junctions. For example, semiconductor nanoparticles may be more easily and cheaply patterned into forming semiconductor junctions when compared to alternate methods, such as silk-screening or deposition.

With respect to shape, configurations of Group IV semiconductor nanoparticles include elongated particle shapes, such as nanowires, or irregular shapes, in addition to more regular shapes, such as spherical, hexagonal, and cubic nanoparticles, and mixtures thereof. Additionally, the nanoparticles may be single-crystalline, polycrystalline, or amorphous in nature. As such, a variety of types of Group IV semiconductor nanoparticle materials may be created by varying the attributes of composition, size, shape, and crystallinity of Group IV semiconductor nanoparticles. Examples include single or mixed elemental composition (including alloys, core/shell structures, doped nanoparticles, and combinations thereof) single or mixed shapes and sizes (and combinations thereof), and single form of crystallinity (or a range or mixture of crystallinities, and combinations thereof)

In general, semiconductor nanoparticles typically must be formed into both dense and low porosity connected regions. One such method is sintering, a method for making particles adhere to each other, and interacting nanocrystals sinter before size-dependent melting occurs, see e.g. A. N. Goldstein, The melting of silicon nanocrystals: Submicron thin-film structures derived from nanocrystal precursors, APPLIED PHYSICS A, 1996.

During sintering, the density of grains may increase as material flows into voids, causing a decrease in the overall volume of thin films. Movement of atoms that occurs during sintering effects the reduction of total porosity by repacking, followed by material transport from the bulk to the surface of the thin film, or from the surface of the thin film into the gas phase.

Consequently, Group IV semiconductor nanoparticles that are substantially spherical and preferably between about 4 nm and about 100 nm in diameter tend to sinter at lower temperatures, and hence are beneficial to create junctions. In yet another configuration, the Group IV semiconductor nanoparticles are substantially spherical and more preferably between about 4.0 nm and about 20.0 nm in diameter. In yet another configuration, the Group IV semiconductor nanoparticles are substantially spherical and most preferably 7.0 nm. Temperatures are preferably selected so as to enable sufficient sintering of the layer of Group IV semiconductor particles.

Figure 2:
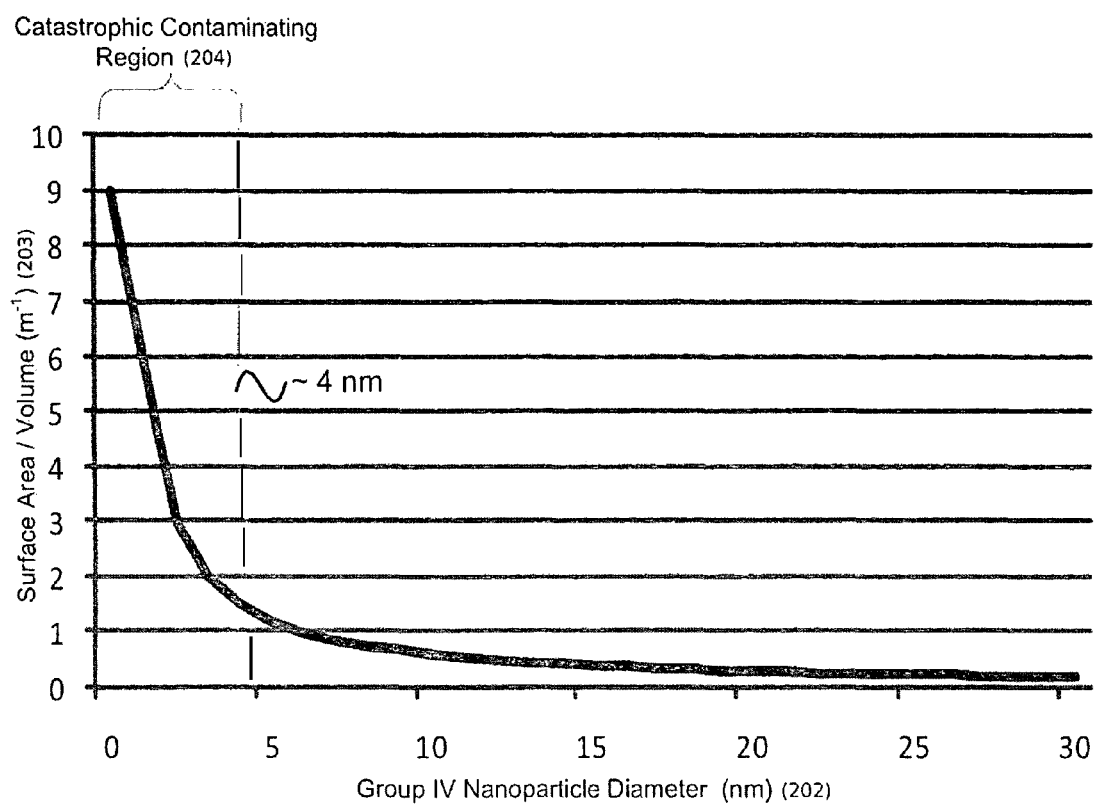
FIG. 2 shows a simplified diagram comparing surface area/volume to diameter for a set of silicon nanoparticles, in accordance with the invention.

Referring now to FIG. 2, a simplified diagram is shown comparing surface area/volume to diameter for a set of Si nanoparticles, in accordance with preferred configurations. Horizontal axis 202 shows Si nanoparticle diameter in nanometers, and vertical axis 203 shows Si surface area/volume in meters$^{-1}$.

In general, Si atoms have an atomic radius of about 0.118 nm and tend to form a diamond crystal structure with a cell dimension of about 0.5431 nm. In addition, although not shown, Ge with an atomic radius of about 0.125 nm and a cell dimension of about 0.566 nm, will have a area/volume to diameter curve that is substantially similar to that of Si.

Below about 4 nm, in the catastrophic contaminating region 204, the surface area/volume ratio increases substantially, from about 1.5 m$^{-1}$ (at about 4 nm) to about 6.0 m$^{-1}$ (at about 1 nm). Eventually, all of the Si atoms are essentially surface or shell atoms, and the likelihood of contamination is extremely high. Thus, for purposes of contamination reduction, the diameter of Group IV nanoparticles should generally be greater than about 4 nm.

Figure 3:
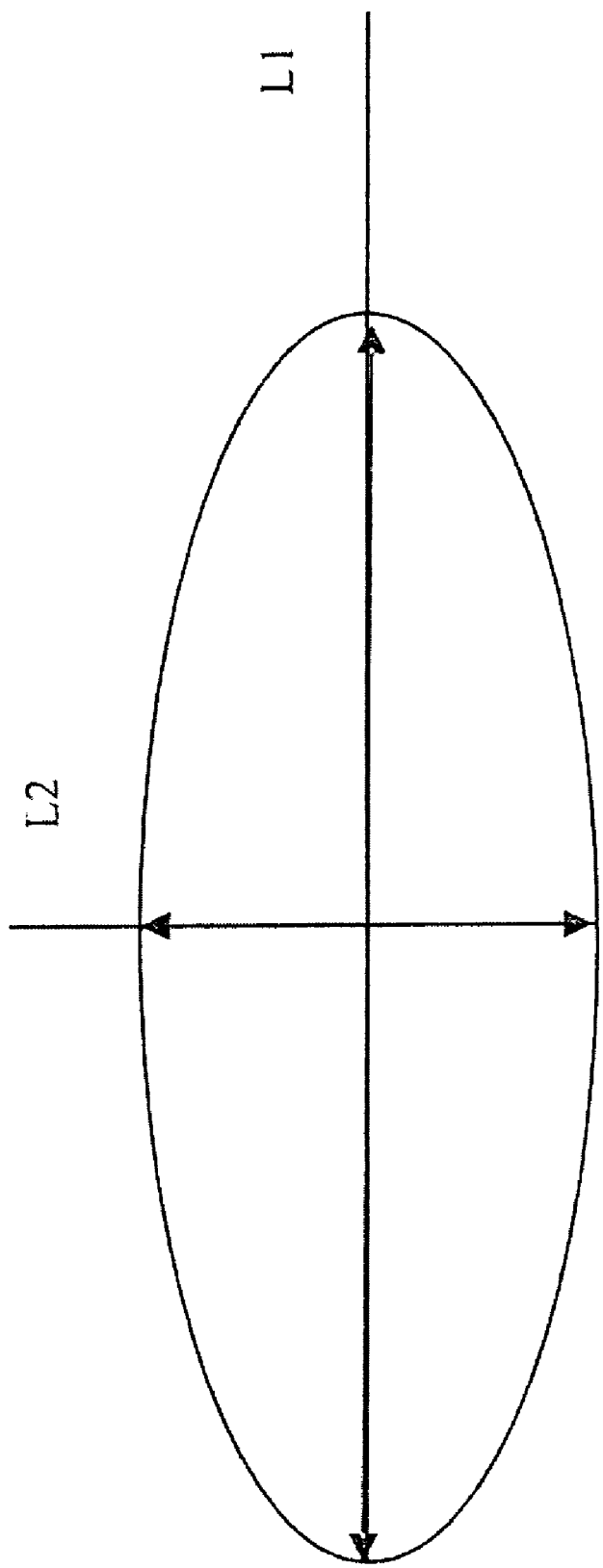
FIG. 3 shows a simplified diagram of sphericity for a Group IV nanoparticle, in accordance with the invention.

Referring now to FIG. 3, a simplified diagram showing sphericity for a Group IV nanoparticle is shown, in accordance with preferred configurations. In general, a metric for particle shape uniformity or sphericity may be obtained by using transmission electron microscopy ("TEM") images. TEM is an imaging, technique whereby a beam of electrons is transmitted through a specimen, and an image is formed, magnified and directed to appear either on a fluorescent screen or a layer of photographic film, or detected by a sensor, such as a CCD camera.

Particle sizes may be measured by identifying individual particles and drawing a straight line across a particle's shortest and longest dimensions, as shown in the graphical example. Uniformity may be defined as the ratio of the maximum diameter over the minimum diameter of a particle. By measuring the particle dimension defined as the ratio of the longest dimension L1 over the shortest dimension L2, one can obtain the metric L1/L2 as the level of sphericity. For example, for an ideal spherical particle, uniformity is equal to about 1.0. For an irregular particle, uniformity is generally substantially larger than about 1.0. For example, if a particle is rod or needle shaped, the L1/L2 ratio may be greater than 5. Optimal sphericity is generally between about 1.0 and about 2.0. Aside from surface contamination, a L1/L2 ratio of below 2 is beneficial to nanoparticle application techniques, such as inkjet printing.

Figure 4:
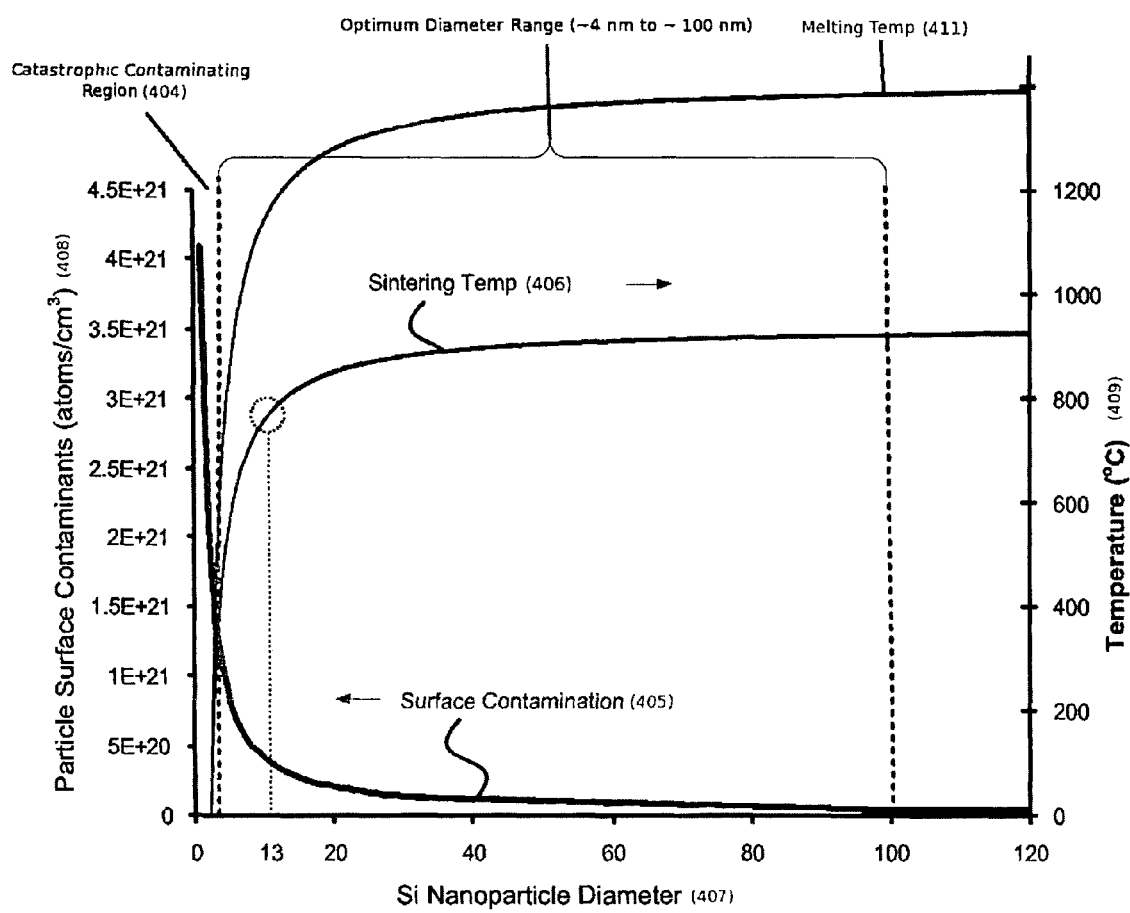
FIG. 4 shows a comparison of surface contamination, sintering temperature and melting temperature to diameter for Si nanoparticles, in accordance with the invention.

Referring now to FIG. 4, particle surface contamination 405, sintering temperature 406 and melting temperature 411 are shown as functions of Si nanoparticle diameter 407, in accordance with preferred configurations. The horizontal axis 407 shows Si nanoparticle diameter, the left vertical axis 408 shows particle surface contaminant concentration (atoms/cm$^3$) and the right vertical axis 409 shows temperature in ° C.

At about a 4 nm diameter, Si particle surface contamination is about 1.02×10$^{21}$ atoms/cm$^3$, corresponding to a surface area/volume ratio of about 1.5 m$^{-1}$ as previously shown. As the Si particle surface contamination increases above about 1.02×10$^{21}$ atoms/cm$^3$ in the catastrophic contaminating region 404, sintering, dense layer formation, and electron-hole recombination are aggravated, as previous stated.

In contrast, below about 13 nm, the sintering temperature of a Si nanoparticle sharply decreases with corresponding decrease in diameter size. Above about 13 nm, it is believed that the sintering temperature increases with an increase in nanoparticle diameter, eventually reaching about 947° C., or 67% of the melting temperature of Si, which is about 1414° C. The relationship equation is:

$$T_S = T_0\left(1 - \frac{\beta}{d}\right)$$

Where '$T_S$' is the nano-particle sintering temperature, '$T_0$' is the sintering temperature of large-grained Si (greater than 150 nm in diameter), '$\beta$' is a constant related to the atomic spacing (approximately 1.88 for Si), and 'd' is the diameter of the nanoparticle.

Likewise, although not shown in the figure, for germanium it is believed that the sintering temperature also gradually increases with a corresponding increase in diameter size, eventually reaching about 628° C., or 67% of the melting temperature of Ge, which is about 938° C.

As previously described, sintering is generally a method for making particles adhere to each other and inducing densification of films. Consequently, because their small radii of curvature, it is believed that nanoparticles generally begin to sinter when a temperature of about two-thirds of the particle melting point is reached. It is further believed that large shear stresses generated by elevated temperatures in neck regions of the nanoparticles tend to cause a plastic deformation between two proximately located nanoparticles. For a given nanoparticles material, smaller nanoparticles generally have a lower sintering temperature than that of larger nanoparticles.

In general, various heat sources may be used to sinter the nanoparticle, such as conventional contact thermal sources (e.g., resistive heaters, etc.), as well as radiative heat sources (e.g., lamps, lasers, microwave processing equipment, plasmas, tungsten-halogen, continuous arc lamps, flash lamps, etc.). In the case of lasers, a wavelength range of between about 0.3 microns and about 10 microns is generally optimal.

In an advantageous manner, lowering the sintering temperature reduces thermally induced stress in the underlying substrate that may subsequently damage the wafer and reduce minority carrier lifetime in photovoltaic applications. Also, a possibility of extrinsic contamination is reduced by reducing the processing temperature.

Additionally, a lower sintering temperature also allows the use of alternative materials in or near the junction (i.e., substrate, dielectric layer, etc.) that may have a melting point substantially below the Group IV melting temperature. For example, polymides (e.g., Kapton, Kaptrex, etc.), with a glass temperature of around 400° C., may be used both as a dielectric and as a mask for production of electrical junctions. In addition, lowering the sintering temperature may allow film formation without further diffusion of dopants that are already diffused into or otherwise positioned within the PV cell structure. Consequently, by sufficiently reducing the Group IV nanoparticle diameter (to about 7 nm in this example), a dense nanoparticle layer may be formed on a polymide layer.

Characteristics of Group IV Nanoparticle Colloidal Dispersions (Inks)

Having described characteristics of Group IV semiconductor nanoparticles, nanoparticle inks formed from the Group IV semiconductor nanoparticles will be described.

Small particles may be more readily suspended in a colloidal dispersion. Because of their small size, nanoparticles tend to be difficult to manipulate. Consequently, in an advantageous manner, assembled nanoparticles may be suspended in a colloidal dispersion (or colloid), such as an ink, in order to transport and store the nanoparticles. The colloidal dispersion defines a formulation of the Group IV nanoparticles used to form the Group IV semiconductor thin films.

A "colloidal dispersion" is a type of homogenous mixture comprising two separate phases, a continuous phase (such as a solvent) and a dispersed phase (generally including individual particles or small agglomerates of particles with a diameter below about 100 nm). In general, the most effective solvents tend to be polar. Polarity generally refers to the dipole-dipole intermolecular forces between the positively-charged end of one molecule and the negatively-charged end of another (or the same) molecule. However, semiconductor particle surfaces tend to be non-polar, and hence lyophobic (or solvent fearing).

A method of dispersing a non-polar particle in a polar solvent is by modifying the particle, surface, often with a polar capping agent or ligand. For example, organic functional groups, such as hydrocarbons (e.g., alkanes, alkenes, alkynes, cycloalkanes, alkadienes) are attached to non-polar particles in order to add polarity and allow molecular Van der Waals forces to disperse the particles in the solvent. In general, the Group IV nanoparticles are transferred to a liquid (or solvent) under vacuum, or else an inert, substantially oxygen-free environment, to form the colloidal dispersion (or formulation of the Group IV semiconductor nanoparticles). In addition, the use of particle dispersal methods and equipment, such as sonication, high shear mixers and high pressure/high shear homogenizers, may be used to facilitate dispersion of the nanoparticles in a predetermined solvent or mixture of solvents.

In addition, once dispersed, these particles will tend to stay suspended and avoid agglomeration via the interaction of the Van der Waals forces, as well as the random thermal movement of the particles (Brownian motion).

In some configurations, the capping agents may be organic compounds, such as alcohols, aldehydes, ketones, carboxylic acids, esters, amines and organosiloxanes. In addition, the solvents may be mixed in order to optimize physical characteristics, such as, e.g., viscosity, density, polarity and boiling point (temperature).

Alternatively, capping agents may be added it situ by the addition of gases, such as, e.g., introducing a gaseous capping group into a plasma chamber used to form the nanoparticles. Capping groups may be removed from the nanoparticles during the sintering process or, alternatively, in a lower temperature pre-heat just before the sintering process.

In some configurations, bulky capping agents suitable for use in the preparation of capped Group IV semiconductor nanoparticles include C4-C8 branched alcohols, cyclic alcohols, aldehydes, and ketones, such as, e.g. tertiary-butanol, isobutanol, cyclohexanol, methyl-cyclohexanol, butanal, isobutanol, cyclohexanone, and oraganosiloxanes, such as methoxy(tris(trimethylsilyl)silane)(MTTMSS), tris(trimethylsilyl)silane (TTMSS), decamethyltetrasiloxane (DMTS), and trimethylmethoxysilane (TMOS).

In the case of Group IV nanoparticles, the colloidal dispersions should disperse well in the selected solvents and should preferably easily filter though a 0.5 µm filter, more preferably through a 0.3 µm filter, in order to optimize printability. Typically, the unit of "microns" is used to characterize filters.

Additionally, various configurations of doped Group IV nanoparticle colloidal dispersions can be formulated by the selective blending of doped, undoped, and/or differently doped Group IV nanoparticles. For example, various formulations of blended Group IV nanoparticle colloidal dispersions can be prepared in which the dopant level for a specific layer of a junction is formulated by blending doped and undoped Group IV nanoparticles to achieve the requirements for that layer. Alternatively, the blended Group IV nanoparticle colloidal dispersions may be used to compensate for substrate defects, such as the passivation of oxygen atoms in order to reduce undesirable energy states.

Once formulated, the colloidal dispersion of Group IV semiconductor nanoparticles may be applied to a substrate and subjected to heat treatment in order to sinter the Group IV nanoparticles into a densified thin film, as discussed in detail below: Examples of application methods include, but are not limited to, roll coating, slot die coating, gravure printing, flexographic drum printing and ink jet printing.

Forming Composite Group IV Semiconductor Nanoparticle Metallization Contacts

Referring now to FIG. 5, a simplified method for the production of Group IV semiconductor nanoparticle metallization contacts is shown, in accordance with the invention. The Group IV semiconductor nanoparticles are preferably formed in an environment that is substantially inert and substantially oxygen-free.

As used herein, "inert" is not limited to only substantially oxygen-free. It is recognized that other fluids (i.e., gases, solvents, and solutions) may react in such a way that they negatively affect the electrical and photoconductive properties of Group IV semiconductor nanoparticles. Additionally, the terms "substantially oxygen-free" in reference to environments, solvents, or solutions refer to environments, solvents, or solutions wherein the oxygen content has been substantially reduced to produce, Group IV semiconductor thin films preferably having no more than $10^{18}$ to $10^{20}$ oxygen per cubic centimeter of Group TV semiconductor thin film.

Group IV semiconductor nanoparticles can be formed undoped, doped with p-type dopants (such as e.g. boron, aluminum), or doped with n-type dopants (such as e.g. phosphorus, arsenic). Preferred embodiments include p-type nanoparticles doped with boron and n-type nanoparticles doped with phosphorus, with dopant concentrations of at least $10^{18}$ cm$^{-3}$.

Referring now to FIG. 5, initially Group IV nanoparticles of desired material and size are provided in an inert environment 510. Next, at step 520, the Group IV nanoparticles are transferred to an inert, substantially oxygen-free environment. As an option, the nanoparticles may be transferred to a solvent (also "dispersion solvent" herein) or solution for the preparation of colloidal dispersions and suspensions of the nanoparticles (or preparation of an ink). For example, the transfer may take place in an ambient environment or under an inert, substantially oxygen-free environment.

Referring to FIG. 5, at step 530, after the Group IV semiconductor nanoparticle synthesis and optional formulation of an ink, the nanoparticles (or the ink) are mixed with a metallization paste to formulate a composite metallization paste (also "composite paste" herein). A metallization paste typically consists of several main components: (1) Ag particles to provide electrical conductivity, (2) a glass frit, which typically contains a variety of metal oxides that are used to penetrate through the silicon nitride antireflection coating during the firing process, and (3) an organic binder for rheological purposes. Examples of such pastes include, but are not limited to, Ferro 33-462, Ferro NS 33-501, 33-502, 33-503, Dupont Solamet® PV14x, PV15x, PV17x, PV135 series. Formulation of the composite paste could be done, e.g. by mixing the paste with the nanoparticle ink, by adding dry Group IV semiconductor-nanoparticles to the paste (nanoparticles could be, for example, hydrogen-terminated, covered with an oxide shell or surface functionalized in any other way), or by evaporating the solvent from the ink and adding the remaining functionalized Group IV semiconductor nanoparticles to the paste. Nanoparticles could also be added to the paste during the actual paste preparation process. Further agitation, heating and/or mixing may be needed to provide a homogeneous mixture.

Optionally, at, step 540, a contact to an emitter region of a substrate can be formed by contacting the substrate with an ink having doped Group IV semiconductor nanoparticles. The substrate can be formed of a Group IV semiconductor (e.g., silicon). The ink can be provided over preferred portions of a top surface of the substrate. The ink can be dried at a temperature between about 100° C. and about 350° C. to form a layer of Group IV semiconductor nanoparticles on the substrate. The ink layer can also be sintered at a temperature between about 600° C. and 1100° C. to form a more robust densified layer.

In optional step 540, using a configuration of an ink formulation, a thin film of Group IV semiconductor nanoparticles is deposited on a solid support, where the thin film is referred to as a green film or porous compact. It is contemplated that a variety of deposition techniques are suitable for the deposition of the dispersion of Group IV nanoparticles on a substrate. As an example, and without limitation, various configurations of ink formulations may be suitable for use with roll coating, slot die coating, gravure printing, flexographic drum printing, and ink jet printing methods, or combinations thereof. Ink jet printing methods include piezoelectric inkjet printing.

In some configurations, it may be necessary to apply additional steps, such as, e.g., thermal oxidation to partially oxidize a deposited porous compact. This may be necessary in order to reduce optical absorption in this layer and reduce minority carrier recombination at the interface between this layer and the emitter in the final photovoltaic cell. Such considerations may become important when the size of the printed compact layer exceeds the size of the metallization layer, which will subsequently come in contact with the nanocrystalline layer.

Next, at step 550, a dielectric layer can be deposited on the substrate. If optional step 540 is employed, the dielectric layer is deposited over the contact formed on the substrate (and in contact with the emitter region). The dielectric layer can be provided using any deposition technique known in the art, such as CVD or plasma-enhanced CVD. The dielectric layer can comprise any dielectric material, such as, e.g., silicon nitride (SiN$_x$), titanium dioxide (TiO$_2$), silicon dioxide (SiO$_2$), or combinations thereof.

Next, at step 560, the composite paste (comprising the metallization paste and Group IV semiconductor nanoparticles, see above) is provided over the dielectric layer. The composite paste is typically provided using screen printing, however other printing methods, such as ink-jet printing can also be used. If a contact to an emitter layer is provided (optional step 540), the paste should preferably be provided substantially over the contact. The metallization paste is optionally dried at a temperature between about 100° C. and about 350° C.

Next, at step 570, the composite paste is fired through the dielectric layer by heating the composite paste to a maximum temperature preferably between about 500° C. and about 1200° C., more preferably between about 700° C. and about 900° C., and most preferably between about 700° C. and about 850° C. This firing through step forms the contact to the substrate (or emitter region of the substrate). Heating can be performed using, e.g., an infrared (IR) belt furnace, or a rapid thermal processor (RTP). The heating time can be between about 10 seconds and about 10 minutes, while the hold time at a target heating temperature is typically between about 1 second and about 10 seconds.

Figure 6B:
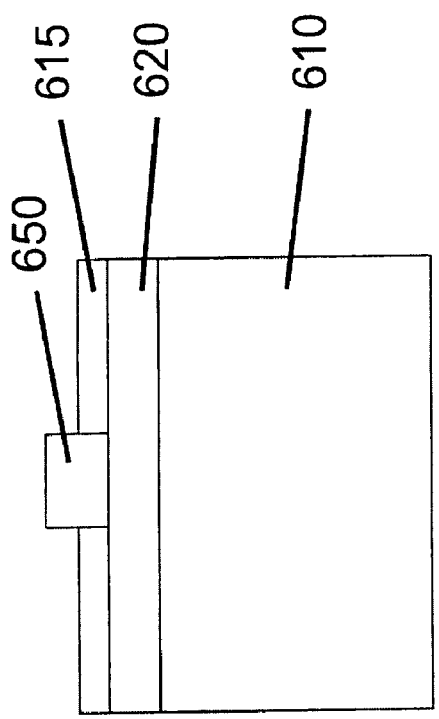
FIGS. 6A-B illustrate a simplified set of diagrams showing the formation of a composite emitter contact for a photovoltaic cell, in accordance with the invention.
Figure 6A:
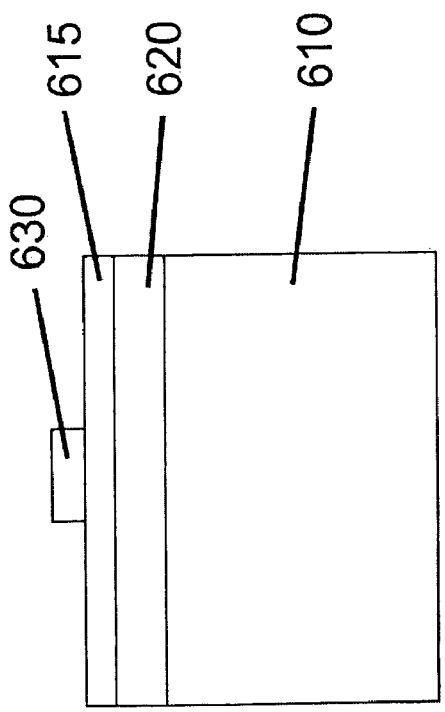

Referring now to FIGS. 6A-B, a simplified set of diagrams showing the formation of a composite emitter contact for a solar cell, in accordance with the invention. That is, an emitter contact (formed of both semiconductor nanoparticles and metal particles) may be deposited on a boundary layer above an emitter region, such that once heat is applied, the portion of the boundary layer directly below the composite emitter contact is penetrated, allowing electrical contact with an underlying emitter. In configurations, the boundary layer can be formed of any dielectric material, such as, e.g., silicon nitride (SiN$_x$), titanium dioxide (TiO$_2$), silicon dioxide (SiO$_2$), or combinations thereof. The boundary layer can serve multiple functions. For instance, the boundary layer can serve as an antireflection layer, a passivation layer, or both.

Referring now to FIG. 6A, a substrate 610 is shown with a dielectric layer 615 deposited on an emitter layer 620. In general, substrate 610 may be formed of one or more Group IV semiconductor elements, such as, e.g., silicon, germanium, or a silicon-germanium alloy, $Si_xGe_{1-x}$, wherein 'x' is a number greater than 0 and less than 1. Further deposited on dielectric layer 615 is composite emitter contact 630. Dielectric layer 615 may be formed of any dielectric material, such as, e.g., silicon $SiN_x$.

Emitter layer 620 may be formed by a variety of methods, which include, without limitation, diffusion from the spin-on or spray-on dopant sources, diffusion from gas phase sources, such as, e.g., $POCl_3$, which a performed at elevated temperatures in, e.g., batch furnace or belt furnace.

Dielectric layer 615 can be deposited by a variety of techniques, such as, e.g., CVD or plasma-enhanced CVD. In configurations, the thickness of dielectric layer 615 can be between about 50 nm and about 100 nm. If dielectric layer 615 is formed of $SiN_x$, a thin $SiO_2$ layer may be deposited prior to $SiN_x$ deposition to enhance the passivation properties of dielectric layer 615.

Substrate 610 and emitter layer 620 can be doped n-type (using, e.g., phosphorous or arsenic as dopant atoms) or p-type (using, e.g., boron or aluminum as dopant atoms). In configurations, if substrate 610 is doped p-type, emitter layer 620 is doped n-type, and vice versa. In one configuration, substrate 610 is doped p-type, and the p-type dopant concentration may be between about $1 \times 10^{14}$ atoms/cm$^3$ and about $1 \times 10^{17}$ atoms/cm$^3$, and emitter layer 620 is doped n-type, and the concentration of n-type dopant may be between about $1 \times 10^{18}$ atoms/cm$^3$ and about $1 \times 10^{21}$ atoms/cm$^3$.

Substrate 610 can have a thickness between about 80 µm and about 300 µm, resistivity between about 0.1 Ohm×cm and about 100 Ohm×cm. Substrate 610 can be formed from a single crystal wafer, such as, e.g., a float zone or Czochralski-grown single crystal wafer, or a polycrystalline wafer (such as e.g. cast multicrystalline (mc), edge-defined film-fed growth (EFG), and string ribbon (STR)). In the case of an n-type emitter, emitter layer 620 can have a sheet resistance preferably between about 40 Ohm/sq and about 200 Ohm/sq, more preferably between about 40 Ohm/sq and 150 Ohm/sq, and most preferably between about 80 Ohm/sq and 120 Ohm/sq. The latter emitter sheet resistance range is more favorable for higher solar cell performance due to reduced emitter recombination, as discussed earlier.

Composite emitter contact 630 can be formed using screen printing in combination with a composite metallization paste, as described above. Composite emitter contact 630 can include Group IV semiconductor-containing nanoparticles with one or more Group IV semiconductor elements (e.g., Si, Ge, $Si_xGe_{1-x}$) with the same dopant type as emitter layer 620. That is, if emitter layer 620 is doped with an n-type dopant, composite emitter contact 630 is also doped with an n-type dopant, and if emitter layer 620 is doped with a p-type dopant, composite emitter contact 630 is also doped with a p-type dopant. Composite emitter contact 630 can also include metal particles or atoms, such as, e.g., silver, aluminum, molybdenum, chromium, titanium, or nickel atoms, as well as a variety of other components present in fire-through metallization pastes, such as metal oxides (e.g., lead borosilicate glass, $B_2O_3$, bismuth oxide, zinc oxide) and polymer binders. The addition of doped Group IV semiconductor nanoparticles to the fire-through paste can prevent depletion of dopant in emitter layer 620 as well as reduce spiking of silver into emitter layer 620 during the fire-through process.

While a single composite emitter contact 630 is shown in FIG. 6A, a set of composite emitter contacts may be provided, the composite emitter contacts being laterally disposed in relation to one another, separated from each other by spaces of predetermined lengths. One or more composite emitter contacts may be provided on dielectric layer 615 using, e.g., screen-printing.

Referring now to FIG. 6B, the structure 600 of FIG. 6A is shown, in which composite emitter contact 630 has etched through dielectric layer 615 to form emitter contact 650 to emitter layer 620. That is, upon the application of heat (i.e., upon "firing-through") at a predetermined fabrication temperature, composite emitter contact 630 "burns through" or "fires through" (also "etches through" herein) dielectric layer 615 to both sinter and to form emitter contact 650 with emitter layer 620. The contact between emitter contact 650 and emitter layer 620 may be an ohmic contact. The total specific resistivity of the contact is preferably between about $1 \times 10^{-5}$ Ohm·cm$^2$ and about $1 \times 10^{-2}$ Ohm·cm$^2$, more preferably between about $1 \times 10^{-5}$ Ohm·cm$^2$ and about $5 \times 10^{-3}$ Ohm·cm$^2$.

Firing through can be accomplished by heating substrate 610 and/or emitter contact 630 (or multiple emitter contacts) to a fire-through temperature. Heating can be performed using, e.g., an infrared (IR) belt furnace, or a rapid thermal processor (RTP). The fire-through (fabrication) temperature is preferably between about 500° C. and about 1200° C., more preferably between about 700° C. and about 900° C., and most preferably between about 700° C. and about 850° C. Total heating times can be between about 10 seconds and 10 minutes, while the hold time at a maximum temperature is typically between about 1 second and 10 seconds. As an alternative, firing through may be completed in two or more heating steps, at, for example, a first fire-through temperature and a second fire-through temperature. In configurations, prior to firing through, emitter contact 630 can be dried by heating substrate 610 and/or emitter contact 630 to a temperature between about 100° C. and about 350° C.

FIGS. 7A-B illustrate the formation of a Group IV semiconductor nanoparticle selective emitter with a composite emitter contact, in accordance with the invention. Generally, a reduced area Group IV semiconductor nanoparticle layer (such as, e.g., a line, set of lines etc.), doped with the same type of dopant as the dopant region, is deposited on and substantially over the dopant region. A dielectric layer is then deposited over the reduced area Group IV semiconductor nanoparticle layer, and a reduced area composite contact is provided on the dielectric layer above the reduced area Group IV semiconductor nanoparticle layer. Upon application of heat, the reduced area composite contact fires through (or etches through) the dielectric layer and forms a contact with the reduced area Group IV semiconductor nanoparticle layer as it undergoes sintering. In configurations, the reduced area composite contact forms an ohmic contact with the reduced area Group IV semiconductor nanoparticle layer, which in turn forms an ohmic contact with the underlying dopant region 715. Dopant region 715 can be, e.g. an emitter region.

In FIG. 7A, a structure 700 having a dopant region 715 is shown. Dopant region 715 is formed via deposition or diffusion of a counter dopant into substrate 710, as previously described. In general, substrate 710 may be formed of one or more Group IV semiconductor elements, such as, e.g., silicon, germanium, or a silicon-germanium alloy, $Si_xGe_{1-x}$, wherein 'x' is a number greater than 0 and less than 1.

A reduced area Group IV semiconductor nanoparticle layer (such as, e.g., a line or a set of lines) 740 is deposited on the dopant-region 715. Reduced area Group IV semiconductor nanoparticle layer 740 comprises Group IV semiconductor nanoparticles that are preferably doped with the same type of dopant (n-type or p-type) as dopant region 715. In configurations, the concentration of dopant (also "chemical dopant" herein) in reduced area Group IV semiconductor nanoparticle layer 740 is greater than the concentration of dopant in dopant region 715. Dielectric layer 720 is deposited above reduced area Group IV semiconductor nanoparticle layer 740, and reduced area composite contact (also "composite contact") 730 is provided on dielectric layer 720 above reduced area Group IV semiconductor nanoparticle layer 740. Dielectric layer 720 may be formed of any dielectric material, such as, e.g., silicon nitride ($SiN_x$, wherein 'x' is a number greater than zero). Methods for forming a reduced area Group IV semiconductor nanoparticle layer over a substrate and a dielectric layer over the reduced area Group. IV semiconductor nanoparticle layer are discussed in U.S. patent application. Ser. No. 12/029,838 filed Feb. 12, 2008, and entitled Group IV Nanoparticle Junctions and Devices Therefrom, which is incorporated herein by reference. Reduced area Group IV semiconductor nanoparticle layer 740 may comprise silicon nanoparticles, germanium nanoparticles, or both. Reduced area Group IV semiconductor nanoparticle layer 740 may be formed by any technique known in the art. For example, reduced area Group IV semiconductor nanoparticle layer 740 can be formed using, e.g., inkjet printing, such as piezoelectric inkjet printing, or screen printing. Although one reduced area Group IV semiconductor nanoparticle layer 740 is shown, multiple reduced area Group IV semiconductor nanoparticle layers 740 (or reduced area Group IV semiconductor nanoparticle islands) may be provided over dopant region 715.

In one configuration, substrate 710 has an n-type dopant concentration between about $1 \times 10^{14}$ atoms/$cm^3$ and about $1 \times 10^{17}$ atoms/$cm^3$, dopant region 715 is doped p-type, with the concentration of p-type dopant being between about, $1 \times 10^{18}$ atoms/$cm^3$ and about $1 \times 10^{21}$ atoms/$cm^3$.

Substrate 710 can have a thickness between about 80 µm and about 300 µm, resistivity between about 0.1 Ohm×cm and about 100 Ohm×cm. Substrate 710 can be formed from a single crystal wafer, such as, e.g., a float zone or Czochralski-grown single crystal wafer, or a polycrystalline wafer (such as e.g., cast multicrystalline (mc), edge-defined film-fed growth (EFG), and string ribbon (STR)). Emitter layer 715 can have a sheet resistance preferably between about 40 Ohm/sq and about 200 Ohm/sq, more preferably between about 40 Ohm/sq and 150 Ohm/sq, and most preferably between about 80 Ohm/sq and 120 Ohm/sq. The latter emitter sheet resistance range is more favorable for higher solar cell performance due to reduced emitter recombination, as discussed earlier.

Composite contact 730 can be formed using screen printing in combination with a composite metallization paste, as described above. Composite contact 730 generally includes Group IV semiconductor-containing nanoparticles with one or more Group IV semiconductor elements (e.g., Si, Ge, $Si_xGe_{1-x}$, wherein 'x' is a number greater than 0 and less than 1), which are commonly doped with the same dopant type as reduced dopant region 715. While a single composite contact 730 is shown in FIG. 7A, structure 700 may comprise a set of composite contacts laterally disposed adjacent one another, separated from each other by spaces of predetermined lengths. Composite contact 730 can also include metal particles or atoms, such as, e.g., silver, aluminum, as well as a variety of other components present in fire-through metallization pastes, such as, e.g., metal oxides (e.g., lead borosilicate glass, $B_2O_3$, bismuth oxide, zinc oxide) and polymer binders. The addition of doped Group IV semiconductor nanoparticles to the fire-through paste can reduce dopant depletion in the dopant region 715 below the composite contact as well as spiking of metal atoms into emitter reduced dopant region 715 during the fire-through process (see below).

Referring now to FIG. 7B, the structure 700 of FIG. 7A is shown in which upon the application of heat, composite contact 730 undergoes sintering and "burns through" or "fires through" dielectric layer 720 to form a front contact 750 with reduced area Group IV semiconductor nanoparticle layer 740. Upon firing through, reduced area Group IV semiconductor nanoparticle layer 740 also undergoes sintering. In configurations, upon firing through, composite contact 730 forms an ohmic contact with reduced area Group IV semiconductor nanoparticle layer 740. The total specific resistivity of the contact is preferably between about $1 \times 10^{-5}$ Ohm·$cm^2$ and about $1 \times 10^{-2}$ Ohm·$cm^2$, more preferably between about $1 \times 10^{-5}$ Ohm·$cm^2$ and about $5 \times 10^{-3}$ Ohm·$cm^2$.

Firing through can be accomplished by heating substrate 710 and/or emitter contact 730 (or multiple emitter contacts) to a fire-through (fabrication) temperature. Heating can be performed using, e.g., an infrared (IR) belt furnace, or a rapid thermal processor (RTP). The fire-through temperature is preferably between about 500° C. and about 1200° C., more preferably between about 700° C. and about 900° C., and most preferably between about 700° C. and about 850° C. Total heating times can be between about 10 seconds and about 10 minutes, while the heating time at a target temperature is typically between about 1 second and about 10 seconds. As an alternative, firing through may be completed in two or more heating steps. For example, firing through may be performed at a first fire-through temperature and a second fire-through temperature. In configurations, prior to firing through, emitter contact 730 can be dried by heating substrate 710 and/or emitter contact 730 to a temperature between about 100° C. and about 350° C.

In other configurations, composite metallization pastes comprising Group IV semiconductor nanoparticles (as described above) could be used to prepare one or more back contacts to various devices, such as, e.g., photovoltaic cells. In the case of photovoltaic cells, such back contacts could be used to form a back-surface-field (BSF). For example, p-doped Group IV semiconductor nanoparticles can be added to Al-based back metallization pastes and applied to the back of the p-type silicon substrates using screen printing. Also, additional nanoparticle thin film layers could be applied in the contact regions, in addition to application of metallization pastes. Addition of Group IV semiconductor nanoparticles can reduce recombination losses in the BSF region as well as reduce contact resistance in that region.

Referring now to FIG. 5A, in a configuration, a substrate 810 is shown with a dielectric layer 815 deposited on the backside of substrate 810. In general, substrate 810 may be formed of one or more Group IV semiconductor elements, such as, e.g., silicon, germanium, or a silicon-germanium alloy, $Si_xG_{1-x}$, wherein 'x' is a number greater than 0 and less than 1. Deposited on dielectric layer 815 is composite back surface field (BSF) contact 830. Dielectric layer 815 may be formed of any dielectric material, such as, e.g., silicon nitride ($SiN_x$), $SiO_2$ or combinations thereof. Substrate 810 can be doped n-type or p-type.

Composite BSP contact 830 can be formed using screen printing in combination with a composite metallization paste, as described above. Composite BSF contact 830 can include Group IV semiconductor-containing nanoparticles with one or more Group IV semiconductor elements (e.g., Si, Ge, $Si_xGe_{1-x}$). Composite BSF contact 830 can also include metal particles or atoms, such as, e.g., silver, aluminum, molybdenum, chromium, titanium, or nickel atoms, as well as a variety of other components present in fire-through metallization pastes, such as metal oxides (e.g., lead borosilicate glass, $B_2O_3$, bismuth oxide, zinc oxide) and polymer binders. The addition of doped Group IV semiconductor nanoparticles to the fire-through paste can prevent depletion of dopant atoms in substrate 810 thus providing a low resistance and low recombination BSF layer, as well as reduce spiking of metal atoms into substrate 810 during the fire-through process, which would increase recombination at the BSF layer. Doping type of Group IV nanoparticles is the same as the doping of the substrate; for example, p-type nanoparticles will be used on the p-type substrate and n-type nanoparticles should be used on the n-type substrate.

While a single composite BSF contact 830 is shown in FIG. 8A, a set of composite BSF contacts may be provided, the composite BSF contacts being laterally disposed in relation to ones another, separated from each other by spaces of predetermined lengths. One or more composite BSF contacts may be provided on dielectric layer 815 using, e.g. screen-printing or inkjet printing.

Referring now to FIG. 8B, the structure 800 of FIG. 8A is shown, in which composite BSF contact 830 has etched through dielectric layer 815 to form BSF contact 850 to substrate 810. That is, upon the application of heat (i.e., upon "firing-through") at a predetermined fabrication temperature, composite BSF contact 830 "burns through" or "fires through" (also "etches through" herein) dielectric layer 815 to both sinter and to form BSF contact 850. The contact between BSF contact 850 and substrate 810 may be an ohmic contact.

As discussed above in the context of FIGS. 6 and 7, firing through can be accomplished by heating substrate 810 to a fire-through temperature. Heating can be performed using, e.g., an infrared (IR) belt furnace, or a rapid thermal processor (RTP). The fire-through (fabrication) temperature is preferably between about 500° C. and about 1200° C., more preferably between about 700° C. and about 900° C., and most preferably between about 700° C. and about 850° C. Total heating times can be between about 10 seconds and 10 minutes, while the heating time at a target fabrication temperature is typically between about 1 second and about 10 seconds. As an alternative firing through may be completed in two or more heating steps, at, for example, a first fire-through temperature and a second fire-through temperature. In configurations, prior to firing through, BSF contact 830 can be dried by heating substrate 810 to a temperature between about 100° C. and about 350° C.

Referring now to FIG. 9A, in another configuration, a device 900 comprises substrate 910, dielectric layer 920 on the backside of substrate 910, a doped Group IV semiconductor nanoparticle layer 930 on the back side of substrate 910, and a screen-print metal paste 940 over the doped Group IV semiconductor nanoparticle layer 930. Group IV semiconductor nanoparticle layer 930 and screen-print metal paste layer 940 may completely cover the backside of substrate 910, or they may be patterned such that only a portion of substrate 910 is covered by layers 930 and 940. Screen-print metal paste 940 may comprise Ag particles or atoms. Optionally, screen-print paste could be mixed with doped Group IV semiconductor nanoparticles. Doping type of Group IV nanoparticles is the same as the doping of the substrate; for example, p-type nanoparticles will be used on the p-type substrate and n-type nanoparticles should be used on the n-type substrate.

Referring now to FIG. 9B, upon the application of heat, screen-print metallization paste 940 can fire through dielectric layer 920 and form an electrical contact with Group IV semiconductor nanoparticle layer 930, which in turn sinters and provides a contact and a BSF to the back of substrate 910. Typical firing conditions are similar to those described above in the context of FIG. 8B.

The configuration of FIGS. 9A-B advantageously enable the use of the same type of paste both on the front and the back of a photovoltaic cell such that firing conditions have to be optimized only for one type of paste. In contrast, when using different paste types for the front and the back side of a substrate (or wafer), achieving optimum performance for the final photovoltaic cell becomes more difficult.

As described above, the configuration illustrated in FIGS. 9A-B can be used with a conventional top metallization, or with improved metallization approaches, as described above in the context of FIGS. 6 and 7. For example, a conventional metallization scheme could be used to prepare the front contact, while Group IV semiconductor nanoparticle-based selective BSF contacts could be prepared on the back of the photovoltaic cell by firing a screen-print paste through a back dielectric layer. As another example, an improved composite front metallization paste (as described in the context of FIGS. 6 and 7) could be used in conjunction with a composite BSF back metallization paste (as descried in the context of FIGS. 8 and 9) to achieve improved photovoltaic cell performance. Front metallization and back metallization can be performed using separate firing steps for each metallization process or a single firing step for both metallization processes. Such configurations could advantageously provide improved material properties. As an example, wafer bowling could be reduced, if not eliminated, using various configurations provided herein.

For the purposes of this disclosure and unless otherwise specified, "a" or "an" means "one or more." All patents, applications, references and publications cited herein are incorporated by reference in their entirety to the same extent as if they were individually incorporated by reference. The word "set" refers to a collection of one or more items or objects. In addition, the methods described may be used for both front-side and back-side solar cell configurations. Furthermore, the word "particle" refers to one or more atoms.

The invention has been described with reference to various specific and illustrative embodiments. However, it should be understood that many variations and modifications may be made while remaining within the spirit and scope of the invention. Advantages of the invention include the production of low cost and efficient junctions for electrical devices, such as solar cells.

Advantages of the invention include the formation of an improved contact with underlying material layers and reduced recombination in the solar cell, thus leading to improved device performance.

Having disclosed exemplary configurations and the best mode, it will be appreciated by those skilled in the art that various omissions, additions and modifications may be made to the disclosed configurations while remaining within the subject and spirit of the invention. All such modifications and changes are intended to fall within the scope of the invention, as defined by the appended claims.

We claim:

1. A method for forming a contact on a substrate, comprising:
providing the substrate, the substrate being doped with a first dopant;
diffusing a second dopant into at least a first side of the substrate to form a second dopant region, the first side further including a first side surface area;
forming a dielectric layer on the first side of the substrate;

forming a set of composite layer regions on the dielectric layer, wherein each composite layer region of the set of composite layer regions further includes a set of Group IV semiconductor nanoparticles and a set of metal particles; and heating the set of composite layer regions to a first temperature, wherein at least some composite, layer regions of the set of composite layer regions etch through the dielectric layer and form a set of contacts with the second dopant region.

2. The method of claim 1, further including the step of forming a set of Group IV semiconductor nanoparticle regions on the first side of the substrate, wherein each Group IV semiconductor nanoparticle region of the set of Group IV semiconductor nanoparticle regions is configured to be between a composite layer region of the set of composite layer regions and the substrate, before the step of forming a dielectric layer on the first side of the substrate.

3. The method of claim 1, wherein the first temperature is between about 500° C. and about 1200° C.

4. The method of claim 1, wherein the first temperature is between about 700° C. and about 900° C.

5. The method of claim 1, wherein the first temperature is between about 700° C. and about 850° C.

6. The method of claim 1, wherein each contact of the set of contacts has a resistivity between about $1 \times 10^{-5}$ Ohm·cm$^2$ and about $5 \times 10^{-3}$ Ohm·cm$^2$.

7. The method of claim 1, wherein the second dopant region is a n-type emitter region, the n-type emitter region having a sheet resistance between about 40 Ohm/sq and 150 Ohm/sq.

8. The method of claim 1, wherein the second dopant region is a n-type emitter region, the n-type emitter region having a sheet resistance between about 80 Ohm/sq and 120 Ohm/sq.

9. The method of claim 1, wherein the dielectric layer includes at least one of $SiN_x$, $SiO_2$, and $TiO_x$.

10. The method of claim 1, wherein an aggregate area of a set of composite layer region surface areas is between about 1% and about 50% of the first side surface area.

11. The method of claim 1, wherein an aggregate area of a set of composite layer region surface areas is between about 2% and about 20% of the first side surface area.

12. The method of claim 1, wherein an aggregate area of a set of composite layer region surface areas is between about 5% and about 10% of the first side surface area.

13. The method of claim 1, wherein the set of metal particles includes one of Al and Ag.

14. The method of claim 1, wherein the set of metal particles further includes a glass frit and an organic binder.

15. The method of claim 1, wherein the first dopant is n-type and the second dopant is p-type.

16. The method of claim 1, wherein the first dopant is p-type and the second dopant is n-type.

17. The method of claim 1, wherein the set of Group IV semiconductor nanoparticles includes a third dopant, the third dopant being the same dopant type as the second dopant.

18. A method for forming a contact on a substrate, comprising:

providing the substrate, the substrate being doped with a first dopant;

forming a dielectric layer on a second side of the substrate;

forming a set of composite layer regions on the dielectric layer, wherein the set of composite layer regions include a set of Group IV semiconductor nanoparticles and a set of metal particles; and heating the set of composite layer regions to a first temperature, wherein at least some composite layer regions of the set of composite layer regions etch through the dielectric layer and form a set of contacts to the substrate.

19. The method of claim 18, further including the step of diffusing a second dopant into at least a first side of the substrate to form a second dopant region, the first side further including a first side surface area.

20. The method of claim 18, further including the step of forming a set of Group IV semiconductor nanoparticle regions on the second side of the substrate, wherein each Group IV semiconductor nanoparticle region of the set of Group IV semiconductor nanoparticle regions is configured to be between a composite layer region of the set of composite layer regions and the substrate, before the step of forming a dielectric layer on the first side of the substrate.

21. The method of claim 18, wherein the dielectric layer includes at least one of $SiN_x$, $SiO_2$, and $TiO_x$.

22. The method of claim 18, wherein the first temperature is between about 500° C. and about 1200° C.

23. The method of claim 18, wherein the first temperature is between about 700° C. and about 900° C.

24. The method of claim 18, wherein the first temperature is between about 700° C. and about 850° C.

25. The method of claim 18, wherein each contact of the set of contacts has a resistivity between about $1 \times 10^{-5}$ Ohm·cm$^2$ and about $5 \times 10^{-3}$ Ohm·cm$^2$.

26. The method of claim 18, wherein an aggregate area of a set of composite layer region surface areas is between about 1% and about 50% of the first side surface area.

27. The method of claim 18, wherein an aggregate area of a set of composite layer region surface areas is between about 2% and about 20% of the first side surface area.

28. The method of claim 18, wherein an aggregate area of a set of composite layer region surface areas is between about 5% and about 10% of the first side surface area.

29. The method of claim 18, wherein the set of metal particles includes one of Al and Ag.

30. The method of claim 18, wherein the set of metal particles further includes a glass frit and an organic binder.

31. The method of claim 19, wherein the first dopant is n-type and the second dopant are p-type.

32. The method of claim 19, wherein the first dopant is p-type and the second, dopant are n-type.

33. The method of claim 18, wherein the set of Group IV semiconductor nanoparticles includes a third dopant, the third dopant being the same dopant type as the first dopant.

* * * * *